United States Patent [19]
Demicheli

[11] Patent Number: 5,477,191
[45] Date of Patent: Dec. 19, 1995

[54] VARIABLE GAIN AMPLIFIER

[75] Inventor: Marco Demicheli, Binago, Italy

[73] Assignee: SGS-Thomson Microelectronics S.r.l., Milan, Italy

[21] Appl. No.: 269,181

[22] Filed: Jun. 30, 1994

[30] Foreign Application Priority Data

Jun. 30, 1993 [EP] European Pat. Off. .............. 93830284

[51] Int. Cl.$^6$ ................................ H03F 3/45; M03G 3/30
[52] U.S. Cl. ............................................ 330/254; 330/300
[58] Field of Search ...................................... 330/252, 254, 330/256, 284, 289, 300

[56] References Cited

U.S. PATENT DOCUMENTS 5,365,192  11/1994  Wagner et al. ...................... 330/252

Primary Examiner—Steven Mottola
Attorney, Agent, or Firm—David V. Carlson; Lawrence W. Nelson; Seed and Berry

[57] ABSTRACT

A temperature-stable variable gain amplifier having a differential input stage coupled to a first terminal of a voltage supply generator and a second terminal of the voltage supply generator through first and second field-effect transistors whose gate terminals are connected to two bipolar transistors which are also connected between the first terminal of the voltage supply generator, through two resistors, and the second terminal of the voltage supply generator, through third and fourth field-effect transistors. Also, the third and fourth transistors have gate terminals connected into a second common control terminal, and the collector terminals of the bipolar transistors form output terminals for the amplifiers.

15 Claims, 5 Drawing Sheets 5,477,191

VARIABLE GAIN AMPLIFIER

TECHNICAL FIELD

This invention relates to variable gain amplifiers (VGA), and in particular to a VGA whose gain is dependent essentially on a control voltage and can be temperature stabilized.

BACKGROUND OF THE INVENTION

In many applications—e.g. automatic gain control (AGC) systems in audio and TV apparatus—the signals whose amplitudes may vary within a wide range need to be amplified so that an amplified signal with constant amplitude can be presented at the output.

In such automatic gain controls as usually comprise at least one variable gain amplifier in a loop structure, a signal level detector, a control current generator driven by the signal level detector, and a stabilizing capacitor, it is indeed the variable gain amplifier that constitutes the most critical part of the arrangement.

For a truly effective control of the gain, the dependence of the variable gain amplifier gain on control voltage should follow an exponential law and this dependence should remain stable as temperature varies.

The most widely used arrangement in the art for implementing a variable gain amplifier is to cut down the gain of a balanced stage using a Gilbert multiplier in the manner shown in FIG. 1.

The signal to be amplified is applied to the input terminals of a differential stage which includes transistors Q1 and Q2.

Further, a control voltage Vcontrol is applied to the input terminals of two differential structures Q3, Q4 and QS, Q6 of a Gilbert multiplier, connected to the legs of the differential stage. The control voltage Vcontrol determines the amplification gain of the signal that appears at the output terminals formed by one of the leg pair of each of the two differential structures.

The problems brought about by this prior approach are the following:

—the gain dependence on the control voltage is not exponential but rather of the "hyperbolic tangent" type, and —the noise introduced by the multiplying cell is high, and a common output mode adjusting circuit must be used.

In order to obtain an exponential type dependence from the control voltage for the amplifier gain, a complicated distortion of the control signal must be resorted to, so that the exponential type dependence is difficult to stabilize when temperature changes.

Another method known to those skilled in the art for providing a variable gain amplifier is to use as gain control a field-effect (FET) $M_{10}$ transistor acting as a variable resistor, in conjunction with load resistors $R_8$, $R_9$, transistors $Q_{11}$ and $Q_{12}$, and current generators $G_{12}$ and $G_{13}$, as shown in FIG. 2.

In such a case, the gain relation to the control voltage follows a quadratic law, and the drawback is even more serious since a limited range of gain values is available, thereby making the cascade connection of at least two stages necessary to expand that range.

A further drawback is a limited input dynamic range.

Similar to the previously mentioned method, any possible exponential dependence obtained by skewing the control voltage would be difficult to stabilize for temperature changes.

SUMMARY OF THE INVENTION

The technical problem is solved by this invention by providing a variable gain amplifier which can provide a gain dependence on control voltage of the exponential type and which is stabilized for temperature changes over a wide range of values of the control voltage, using simpler and more economical circuitry.

In particular, a variable gain amplifier of the type described and characterized in the appended claims to this specification is disclosed herein.

For example, a variable gain amplifier is disclosed, which has a first input terminal and a second input terminal, as well as a first output terminal and a second output terminal. The variable gain amplifier comprises a first gain stage comprising a differential stage coupled to a voltage supply generator having a first terminal and a second terminal. The differential stage includes a first variable resistance load element coupling the first input terminal of the amplifier to the second terminal of the voltage supply generator. The first variable resistance load element has a control terminal. The differential stage also includes a second variable resistance load element coupling the second input terminal of the amplifier to the second terminal of the voltage supply generator. The second variable resistance load has a control terminal coupled to the control terminal of the first variable resistance load element. Further, the differential stage also includes a first output terminal positioned between the first input terminal of the amplifier and the first variable resistance load element, and a second output terminal positioned between the second input terminal of the amplifier and the second variable resistance load element. The variable gain amplifier also comprises a second gain stage cascade connected with the first gain stage between the first terminal and the second terminal of the voltage supply generator. The second stage comprises a first transistor having a first terminal coupled to the first terminal of the voltage supply generator and forming a first-second stage output terminal, a second terminal, and a control terminal, the control terminal of the transistor being coupled to the first output terminal of the differential stage. The second gain stage also comprises a second transistor having a terminal coupled to the first terminal of the voltage supply generator and forming a second-second stage output terminal, a second terminal, and a control terminal. The control terminal of the second transistor is coupled to the second output terminal of the differential stage. The second gain stage further comprises a third variable resistance load element coupling the second terminal of the first transistor to the second terminal of the voltage supply generator. The third variable resistance load element has a control terminal. Finally, the second gain stage comprises a fourth variable resistance load element coupling the second terminal of the second transistor to the ground terminal of the voltage supply generator, the fourth variable resistance load element has a control terminal coupled to the control terminal of the third variable resistance load element.

BRIEF DESCRIPTION OF THE DRAWINGS

The features and advantages of an amplifier according to the invention will become apparent from the following description of an embodiment thereof, given by way of example and not limited by the accompanying drawings.

In the drawings.

DETAILED DESCRIPTION OF THE PRESENTLY PREFERRED

Figure 1:
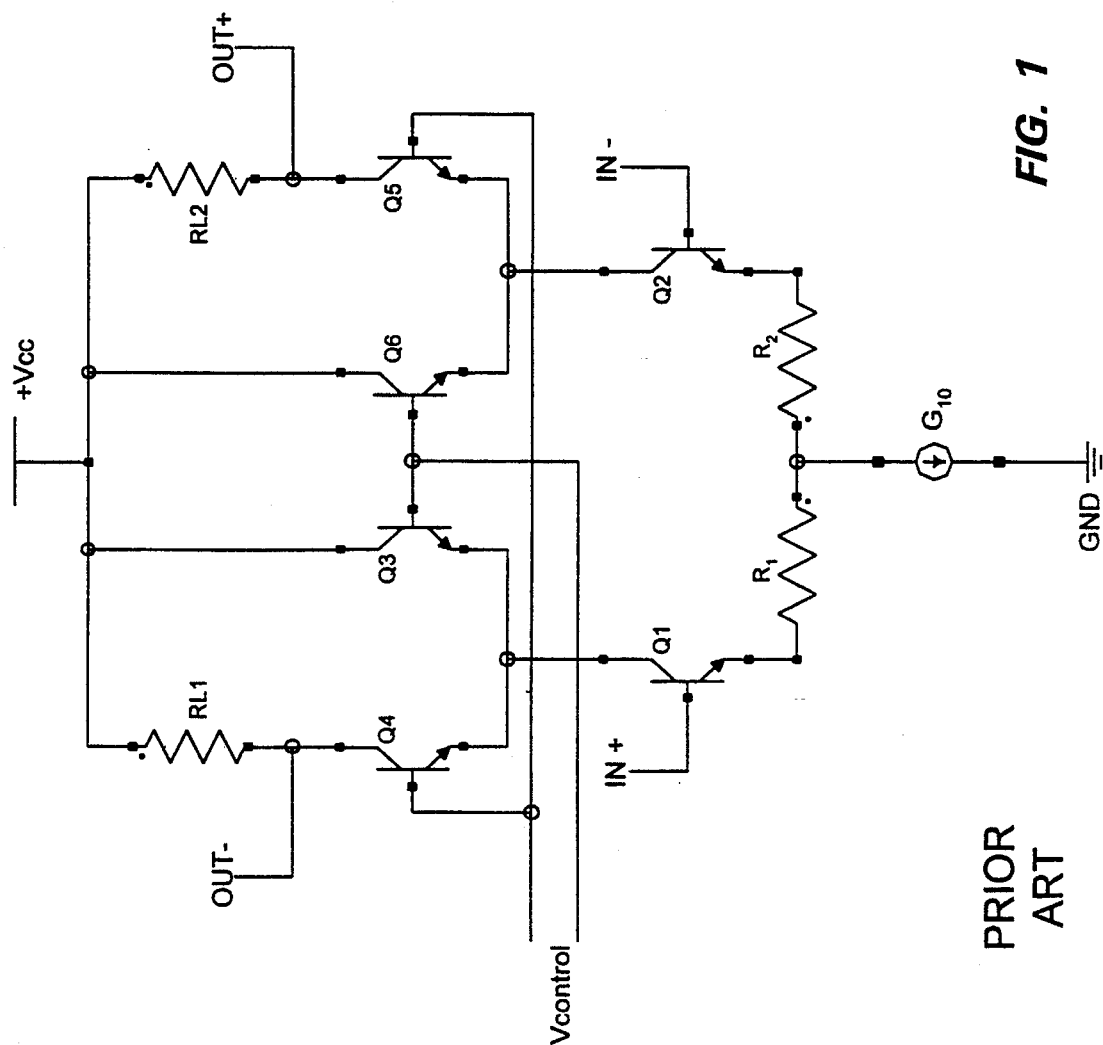
FIGS. 1 and 2 show circuit diagrams for variable gain amplifiers of known types.
Figure 2:
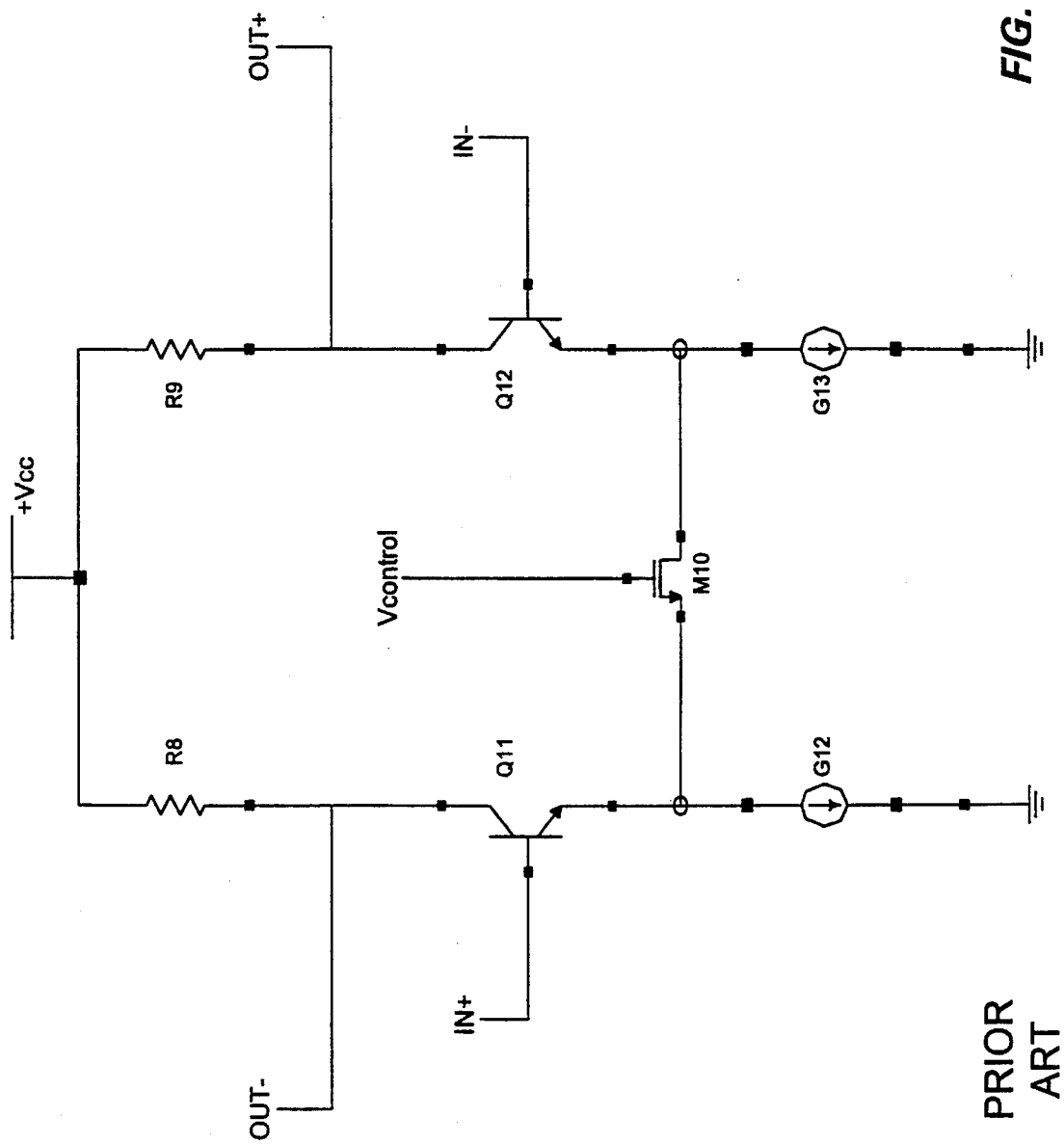
Figure 3:
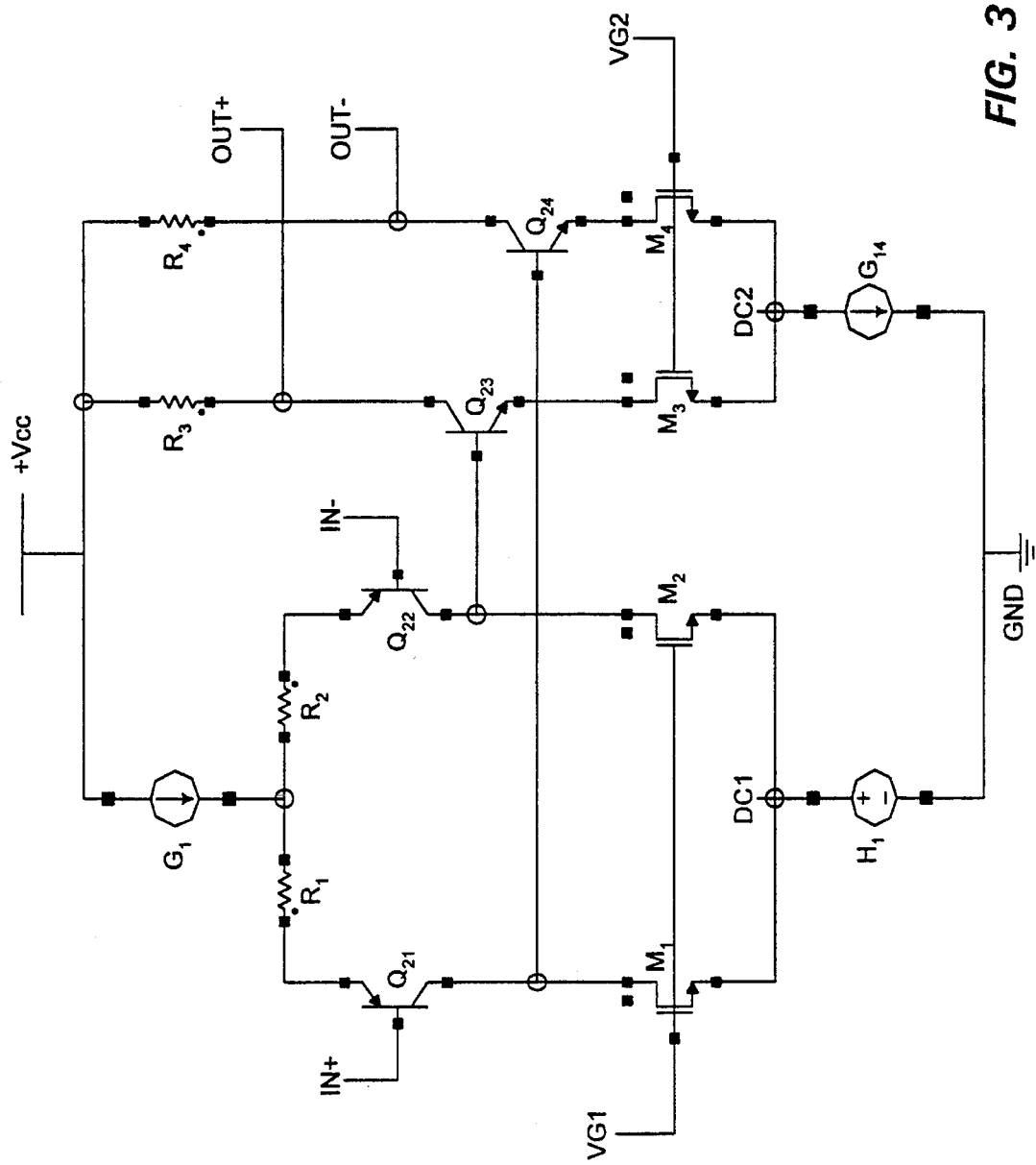
FIG. 3 shows a circuit diagram for a variable gain amplifier according to the present invention.

The circuit diagram of FIG. 3 comprises first and second cascade-connected gain stages which constitute the core portion of a variable gain temperature-stabilized amplifier according to the invention.

The first gain stage includes a differential input stage coupled to a first terminal +Vcc of a voltage supply generator through a constant current generator G1 and comprising two transistors Q21, Q22 and two resistors R1, The control terminals of the transistors are the amplifier input terminals IN+ and IN−.

The output terminals of the differential stage are coupled to a second terminal, GND, of the voltage supply generator, through two field-effect transistors M1, M2, which function as variable resistance load elements, and a first circuit node DC1 which is connected to a voltage source $H_r$.

The gate terminals of such transistors are connected together into a control terminal VG1.

The transistors Q21 and Q22 may be bipolar transistors.

The second gain stage comprises third and fourth transistors Q23 and Q24 which may be bipolar, such transistors have control terminals connected to the output terminals of the differential stage.

The transistors Q23 and Q24 are connected between the first terminal of the voltage supply generator, through two resistors R3 and R4, and the second terminal GND of the voltage supply generator, through two field-effect transistors M3 and M4, which function as variable resistance circuit elements, that is, emitter degeneration resistors and through a second circuit node DC2, which is connected to current source $G_{14}$.

The gate terminals of the transistors M3 and M4 are connected together into a second control terminal VG2.

The amplifier output terminals OUT+ and OUT− consist of two terminals of the transistors Q23 and Q24.

The cascade connection of two variable gain stages allows a wide range of gain values to be covered.

The circuit embodiment as shown in FIG. 3 avoids both the disadvantage of having the minimum linearity range for input voltages when gain is at a minimum and the drawback of noise being introduced by a gain control stage.

By having the input signal applied to a fully differential structure, the advantage of canceling the effects of a second order non-linearity introduced by the field-effect transistors, which control the gain, and this technical result (in claim) can be obtained.

Since such transistors function first as load and then to provide emitter degeneration, linearity can be further improved compared to conventional approaches.

Figures 4A, 4B:
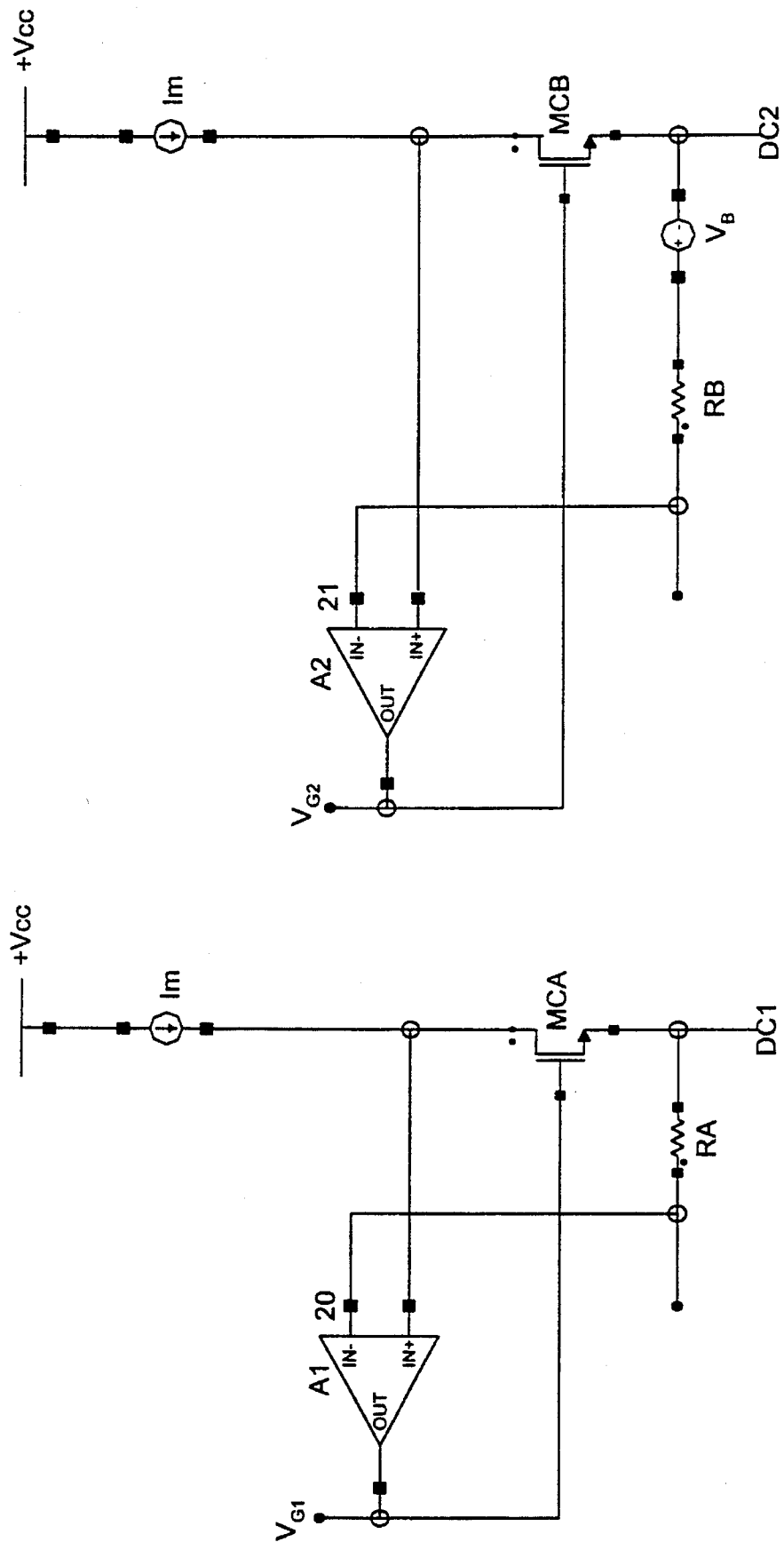
FIGS. 4A, 4B, and 5 show in circuit diagram form component parts of a control circuit for the amplifier in FIG. 3.

An example of a control circuit for the variable gain amplifier according to the invention is depicted in FIGS. 4A and 4B. Shown in FIG. 4A is a first control circuit and shown in FIG. 4B is a second control circuit which respectively comprise a field-effect transistor MCA and a field-effect transistor MCB, which transistors function as a variable resistance load element and a variable resistance circuit element, respectively.

The transistor MCA, connected between the first terminal of the voltage supply generator and the first circuit node DC1, is also connected in series with a resistor RA between the inverting and non-inverting input terminals of a first operational amplifier A1. The output terminal of that amplifier is connected to the gate terminal of the transistor MC A and the control terminal VG1, which is shown in FIG. 3.

The transistor MCB, connected between the first terminal of the voltage supply generator and the second circuit node DC2, is also connected in series with a resistor RB and a voltage generator VB between the inverting and non-inverting input terminals of a second operational amplifier A2. The output terminal of that amplifier is connected to the gate terminal of the transistor MCB and the control terminal VG2, which is shown in FIG. 3.

The feedback loops which include the amplifiers A1 and A2 impose predetermined values of the drain-source resistances of the transistors MCA and MCB. The imposed resistances are, therefore, unaffected by temperature and any process spread.

The transistors M1, M2, M3 and M4, which set the amplifier gain, operate in the same polarization conditions as the reference transistors MCA and MCB, and accordingly, the control circuits will impose the same drain-source resistance on them too, thereby controlling the amplifier gain. To obtain an exponential dependence of the gain on the control voltage, the circuit shown in FIG. 5 should be used to impose the voltage drop across the resistors RA and RB.

Figure 5:
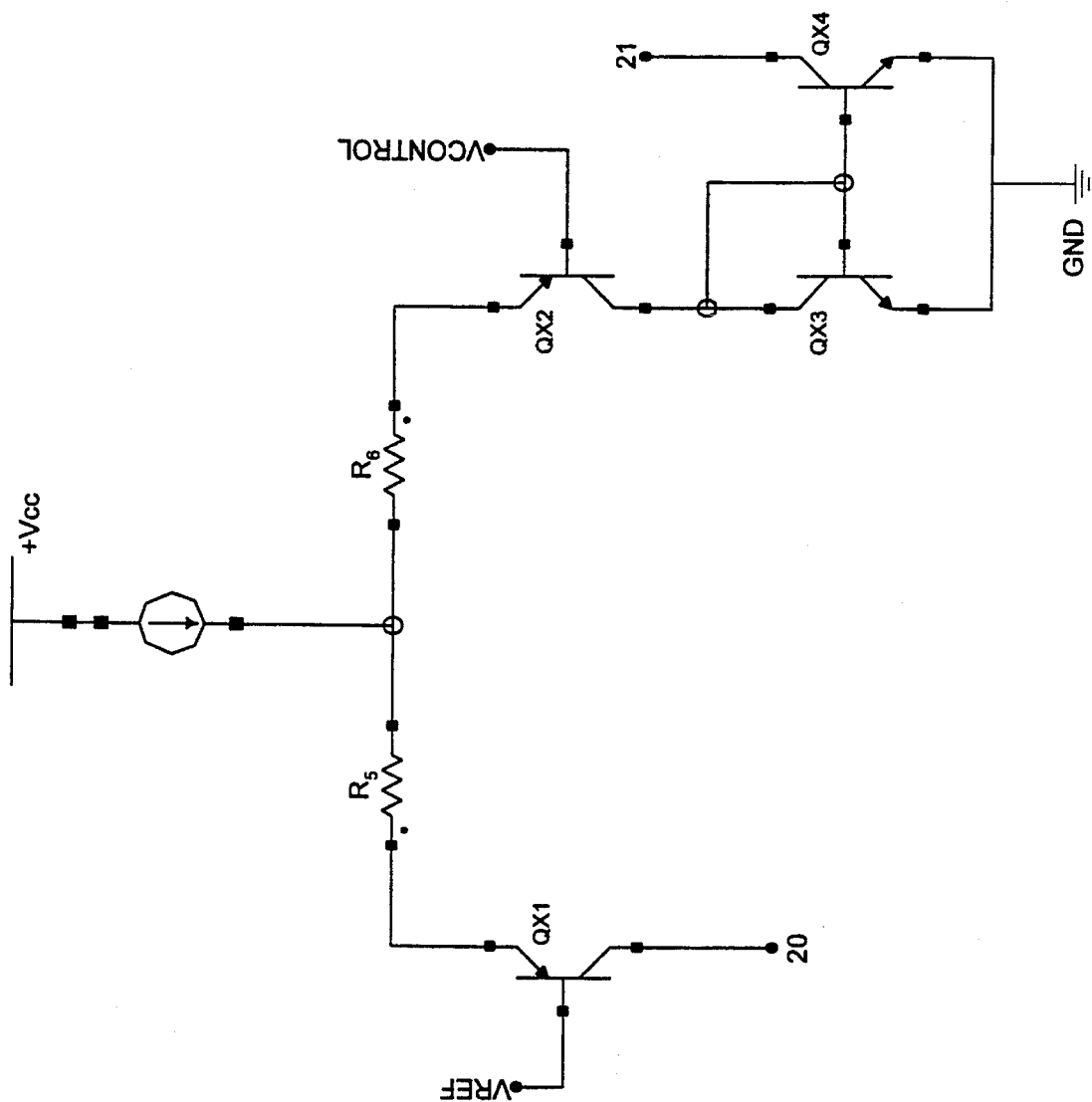

The control circuit of FIG. 5 includes a differential input stage which is connected to an output terminal as well as to an input leg of a current mirror circuit and has resistors $R_5$ and $R_6$. The other output terminal 20 of the differential stage and the output leg 21 of the current mirror circuit are respectively connected to the inverting input terminal of amplifier A1 and the inverting terminal of amplifier A2.

To an input terminal of the differential stage shown in FIG. 5, with transistors QX1 and QX2, is applied a reference voltage Vref, whilst the control voltage Vcontrol is applied to the other input terminal.

The temperature-wise stability and independence from process spreads of the control element resistances ensure stability for the characteristic curve of the variable gain amplifier versus temperature. The low gain required for the amplifiers A1 and A2 allows for their implementation with very simple structures, thereby limiting the circuit complexity of a variable gain amplifier according to the invention.

It will be appreciated that modifications or integrations may be made to the embodiment described above without departing from the scope of the appended claims.

Although specific embodiments of the invention have been described for purposes of illustration, various modifications may be made without departing from the spirit and scope of the invention, as is known by those skilled in the art. Accordingly, the invention is not limited by the disclosure, but instead its scope is to be determined entirely by reference to the following claims.

I claim:

1. A variable gain amplifier comprising first and second gain stages cascade connected between first and second terminals of a voltage supply generator, characterized in that the first gain stage comprises a differential stage coupled to the first terminal of the voltage supply generator and having first and second input terminals which form first and second input terminals for the amplifier, as well as first and second output terminals coupled to the second terminal of the voltage supply generator, respectively through first and second variable resistance load elements having a first common control terminal, and that the second gain stage comprises first and second transistors each having first and second terminals and a control terminal, the control terminals of said first and second transistors being respectively connected to the first and second output terminals of the differential stage, the first terminals of said first and second transistors being both coupled to the first terminal of the voltage supply generator and forming respectively a first output terminal and a second output terminal for the amplifier, the second terminals of the first and second transistors being both coupled to the second terminal of the voltage supply generator through respective first and second variable resistance circuit elements which are both connected to a second common control terminal.

2. A variable gain amplifier according to claim 1, further comprising:

first and second control circuits, of which —the first control circuit comprises a third variable resistance load element connected between the first terminal of the voltage supply generator and a first circuit node between the first and the second variable resistance load element and having a control terminal; and a first operational amplifier having an inverting input terminal, a non-inverting input terminal, and an output terminal, the inverting input terminal being connected, through a first resistive element, to a first end of the third variable resistance load element, the non-inverting input terminal being connected to a second end of the third variable resistance load element, and the output terminal being connected to both the control terminal of the third variable resistance load element and the first common control terminal; and —the second control circuit comprises a third variable resistance circuit element connected between the first terminal of the voltage supply generator and a second circuit node between the first and the second variable resistance load elements and having a control terminal, and a second operational amplifier having an inverting input terminal, a non-inverting input terminal, and an output terminal, the inverting input terminal being connected, through a second resistive element and a voltage generator, to a first end of the third variable resistance circuit element, the non-inverting input terminal being connected to a second end of the third variable resistance circuit element, and the output terminal being connected to both the control terminal of the third variable resistance circuit element and the second common control terminal.

3. A variable gain amplifier according to claim 2, further comprising a control circuit including a differential input stage having first and second input terminals, and first and second output terminals, and a current mirror circuit having an input leg and an output leg, the input leg of said current mirror circuit being connected to the second output terminal of the differential stage, the first output terminal of the differential stage and the output leg of the current mirror circuit being respectively connected to the inverting input terminal of the first operational amplifier and the inverting input terminal of the second operational amplifier.

4. A variable gain amplifier according to claim 1 wherein the first and second variable resistance load elements comprise field-effect transistors with interconnected gate terminals.

5. A variable gain amplifier according to claim 1 wherein the first and second variable resistance circuit elements comprise field-effect transistors with interconnected gate terminals.

6. A variable gain amplifier according to claim 2 wherein the third variable resistance load element and third variable resistance circuit element are field-effect transistors and the control terminals are gate terminals.

7. A variable gain amplifier according to claim 3 wherein the third variable resistance load element and third variable resistance circuit element are field-effect transistors and the control terminals are gate terminals.

8. A variable gain amplifier according to claim 2 wherein the first and second variable resistance load elements comprise field-effect transistors with interconnected gate terminals.

9. A variable gain amplifier according to claim 3 wherein the first and second variable resistance load elements comprise field-effect transistors with interconnected gate terminals.

10. A variable gain amplifier according to claim 2 wherein the first and second variable resistance circuit elements comprise field-effect transistors with interconnected gate terminals.

11. A variable gain amplifier according to claim 3 wherein the first and second variable resistance circuit elements comprise field-effect transistors with interconnected gate terminals.

12. A variable gain amplifier according to claim 4 wherein the first and second variable resistance circuit elements comprise field-effect transistors with interconnected gate terminals.

13. A variable gain amplifier having a first input terminal and a second input terminal as well as a first output terminal and a second output terminal, said variable gain amplifier comprising:

a first gain stage comprising:
a differential stage coupled to a voltage supply generator having a first terminal and a second terminal, said differential stage including:
a first variable resistance load element having a first terminal coupled to the first input terminal of the amplifier and a second terminal coupled to the second terminal of the voltage supply generator, said first variable resistance load element coupled to the second input terminal of the amplifier and a second terminal coupled also having a control terminal;
a second variable resistance load element having a first terminal to the second terminal of the voltage supply generator, said second variable resistance load element also having a control terminal which is coupled to the control terminal of said first variable resistance load element;
a first output terminal connected to the first terminal of said first variable resistance load element; and
a second output terminal connected to the first terminal of said second variable resistance load element; and a second gain stage cascade connected with said first gain stage between the first terminal and the second terminal of the voltage supply generator, said second stage comprising:
a first transistor having a first terminal coupled to the first terminal of the voltage supply generator and forming a first-second stage output terminal, a second terminal, and a control terminal, the control terminal of said first transistor being coupled to the first output terminal of said differential stage;

a second transistor having a first terminal coupled to the first terminal of the voltage supply generator and forming a second-second stage output terminal, a second terminal, and a control terminal, said control terminal of said second transistor being coupled to said second output terminal of said differential stage;

a third variable resistance load element coupling said second terminal of said first transistor to the second terminal of the voltage supply generator, said third variable resistance load element having a control terminal; and a fourth variable resistance load element coupling said second terminal of said second transistor to the second terminal of the voltage supply generator, said fourth variable resistance load element having a control terminal coupled to said control terminal of said third variable resistance load element.

14. A variable gain amplifier according to claim 13, further comprising:

a first control circuit including:
   a fifth variable resistance load element coupling the first terminal of the voltage supply generator to a first circuit node coupling said first and second variable resistance load elements, said fifth variable resistance load element having a first end terminal, a second end terminal and a control terminal;

a first operational amplifier having an inverting input terminal, a non-inverting input terminal connected to the second end terminal of said fifth variable resistance load element, and an output terminal coupled to both the control terminal of the fifth variable resistance load element and the control terminal of the first variable resistance load element; and a first fixed resistive element coupling the inverting terminal of said first operational amplifier to the first circuit node; and a second control circuit including:
   a sixth variable resistance load element coupling the second terminal of the voltage supply generator to a second circuit node coupling said third and fourth variable resistance load elements, and having a first end terminal and a second end terminal, and a control terminal;

a second operational amplifier having an inverting input terminal, a non-inverting input terminal connected to the second end of the sixth variable resistance load element, and an output terminal coupled to both the control terminal of the sixth variable resistance load element and the control terminal of said fourth variable resistance load element; and a second fixed resistive element coupling to the inverting input terminal of said second operational amplifier to the second circuit node via a second voltage generator.

15. A variable gain amplifier according to claim 14, further comprising:

a third control circuit having a first input terminal and a second input terminal, said third control circuit including:
   a differential input stage having a first input terminal, a second input terminal, a first output terminal coupled to the inverting input terminal of said first operational amplifier, and a second output terminal; and
   a current mirror circuit having an input leg coupled to the second output terminal of said differential input stage and an output leg coupled to said inverting input terminal of said second operational amplifier.

* * * * *

UNITED STATES PATENT AND TRADEMARK OFFICE
CERTIFICATE OF CORRECTION

PATENT NO. : 5,477,191
DATED : December 19, 1995
INVENTOR(S) : Marco Demicheli

It is certified that error appears in the above-indentified patent and that said Letters Patent is hereby corrected as shown below:

In column 6, claim 13, lines 44-46, please delete "coupled to the second input terminal of the amplifier and a second terminal coupled".

In column 6, claim 13, line 49, following "first terminal", please insert--coupled--.

In column 6, claim 13, line 49, following "second", please insert--input--.

In column 6, claim 13, line 49, following "terminal of the", please insert--amplifier and a second terminal coupled to the second terminal of the--.

Signed and Sealed this

Twenty-fifth Day of June, 1996

Attest:

BRUCE LEHMAN

*Attesting Officer*     *Commissioner of Patents and Trademarks*